(12) United States Patent
Ohno et al.

(10) Patent No.: US 10,370,775 B2
(45) Date of Patent: Aug. 6, 2019

(54) SILICON CARBIDE EPITAXIAL WAFER MANUFACTURING METHOD, SILICON CARBIDE SEMICONDUCTOR DEVICE MANUFACTURING METHOD AND SILICON CARBIDE EPITAXIAL WAFER MANUFACTURING APPARATUS

(71) Applicant: Mitsubishi Electric Corporation, Tokyo (JP)

(72) Inventors: Akihito Ohno, Tokyo (JP); Kenichi Hamano, Tokyo (JP); Takashi Kanazawa, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 86 days.

(21) Appl. No.: 15/372,949

(22) Filed: Dec. 8, 2016

(65) Prior Publication Data

US 2017/0314160 A1    Nov. 2, 2017

(30) Foreign Application Priority Data

Apr. 27, 2016    (JP) .................... 2016-089735

(51) Int. Cl.
| | |
|---|---|
| C30B 29/36 | (2006.01) |
| C23C 16/32 | (2006.01) |
| C30B 25/14 | (2006.01) |
| C30B 25/20 | (2006.01) |
| H01L 21/02 | (2006.01) |

(52) U.S. Cl.
CPC ............ *C30B 29/36* (2013.01); *C23C 16/325* (2013.01); *C30B 25/14* (2013.01); *C30B 25/20* (2013.01); *H01L 21/0262* (2013.01); *H01L 21/02378* (2013.01); *H01L 21/02529* (2013.01); *H01L 21/02658* (2013.01)

(58) Field of Classification Search
CPC combination set(s) only.
See application file for complete search history.

(56) References Cited

U.S. PATENT DOCUMENTS

| | | | |
|---|---|---|---|
| 2005/0214455 A1* | 9/2005 | Li | C23C 16/4404 427/248.1 |
| 2006/0118048 A1* | 6/2006 | Maccalli | C23C 16/4584 118/728 |
| 2009/0229519 A1 | 9/2009 | Saitoh | |

FOREIGN PATENT DOCUMENTS

| | | |
|---|---|---|
| JP | 2003-282445 A | 10/2003 |
| JP | 4534978 B2 | 9/2010 |
| JP | 2013-016562 A | 1/2013 |

OTHER PUBLICATIONS

An Office Action mailed by the Korean Intellectual Property Office dated Jun. 20, 2018, which corresponds to Korean Patent Application No. 10-2017-0053627 and is related to U.S. Appl. No. 15/372,949.

* cited by examiner

*Primary Examiner* — Erin F Bergner
(74) *Attorney, Agent, or Firm* — Studebaker & Brackett PC

(57) ABSTRACT

A silicon carbide epitaxial wafer manufacturing method includes: a stabilization step of nitriding, oxidizing or oxynitriding and stabilizing silicon carbide attached to an inner wall surface of a growth furnace; after the stabilization step, a bringing step of bringing a substrate in the growth furnace; and after the bringing step, a growth step of epitaxially growing a silicon carbide epitaxial layer on the substrate by supplying a process gas into the growth furnace to manufacture a silicon carbide epitaxial wafer.

11 Claims, 4 Drawing Sheets

SILICON CARBIDE EPITAXIAL WAFER MANUFACTURING METHOD, SILICON CARBIDE SEMICONDUCTOR DEVICE MANUFACTURING METHOD AND SILICON CARBIDE EPITAXIAL WAFER MANUFACTURING APPARATUS

BACKGROUND OF THE INVENTION

Field

The present invention relates to a silicon carbide epitaxial wafer manufacturing method, a silicon carbide semiconductor device manufacturing method and a silicon carbide epitaxial wafer manufacturing apparatus.

Background

In recent years, silicon carbide (SiC) semiconductors whose bandgap, dielectric breakdown electric field intensity, saturated drift velocity and thermal conductivity are each higher than the corresponding value of silicon semiconductors have attracted attention mainly as a material for power devices for power control. In fact, power devices using such SiC semiconductors can have a markedly reduced power loss, can be made smaller in size, enable energy saving at the time of power conversion for power supply, and are, therefore, key devices in realizing a low-carbon society, for example, by improving the performance of electric vehicles and by improving the functions of solar battery systems and the like. Examples of such power devices are a metal oxide semiconductor field effect transistor (MOSFET), a Schottky barrier diode, an insulated gate bipolar transistor (IGBT) and other various diodes.

When a SiC power device is made, an active region of the semiconductor device is ordinarily grown epitaxially on a SiC bulk single crystal substrate in advance by thermal chemical vapor deposition (thermal CVD) or the like. The active region referred to here is a sectional region meticulously made by precisely controlling the doping density in a crystal and the film thickness, the sectional region containing a growth direction axis. The reason that such an epitaxially grown layer is required in addition to the bulk single crystal substrate is that the doping density and the film thickness are determined fairly strictly in advance according to the specifications of the device and accuracies of the doping density and the film thickness higher than those for the bulk single crystal substrate are ordinarily needed.

A wafer having an epitaxially grown layer formed on a SiC bulk single crystal substrate will be referred to as "epitaxial wafer" below. A silicon carbide semiconductor device is made by performing various kinds of processing on a silicon carbide epitaxial wafer. If defects exist in the silicon carbide epitaxial wafer due to faults in the silicon carbide substrate and the silicon carbide epitaxially grown layer during growth, a place where a high voltage cannot be maintained can occur locally, resulting in generation of a leak current. If the density of such defects is increased, the yield of the silicon carbide semiconductor device at the time of manufacturing is reduced.

For example, a silicon carbide epitaxial wafer manufacturing apparatus having a susceptor formed of a member made of graphite and coated with silicon carbide is disclosed (see, for example, JP 4534978). A graphite susceptor is also disclosed which is coated with silicon carbide and has $SiO_2$ film or $Si_3N_4$ film formed on the silicon carbide surface (see, for example, JP 2013-16562 A).

Silicon carbide is also attached to inner wall surfaces of a growth furnace, and this silicon carbide tends to form silicon carbide particles because of the brittleness of its structure. If silicon carbide particles are attached to the surface of a silicon carbide wafer, crystal defects such as downfalls and triangular defects are generated from the places where the silicon carbide particles are attached, resulting in a reduction in device yield. In a case where $SiO_2$ film or $Si_3N_4$ film is formed on the surface of a susceptor, and where silicon carbide is epitaxially grown on the $SiO_2$ film or $Si_3N_4$ film, the adhesion between silicon carbide and the film is so low that silicon carbide particles can easily be generated and crystal defects are increased.

SUMMARY

In view of the above-described problems, an object of the present invention is to provide a silicon carbide epitaxial wafer manufacturing method, a silicon carbide semiconductor device manufacturing method and a silicon carbide epitaxial wafer manufacturing apparatus capable of manufacturing a silicon carbide epitaxial wafer having fewer crystal defects.

According to the present invention, a silicon carbide epitaxial wafer manufacturing method includes: a stabilization step of nitriding, oxidizing or oxynitriding and stabilizing silicon carbide attached to an inner wall surface of a growth furnace; after the stabilization step, a bringing step of bringing a substrate in the growth furnace; and after the bringing step, a growth step of epitaxially growing a silicon carbide epitaxial layer on the substrate by supplying a process gas into the growth furnace to manufacture a silicon carbide epitaxial wafer.

In the present invention, silicon carbide attached to the inner wall surfaces of the growth furnace is stabilized by being nitrided before epitaxial growth is performed, thus enabling inhibition of generation of silicon carbide particles. Manufacturing of a silicon carbide epitaxial wafer having fewer crystal defects due to silicon carbide particles is enabled thereby.

Other and further objects, features and advantages of the invention will appear more fully from the following description.

DESCRIPTION OF EMBODIMENTS

A silicon carbide epitaxial wafer manufacturing method, a silicon carbide semiconductor device manufacturing method and a silicon carbide epitaxial wafer manufacturing apparatus according to the embodiments of the present invention will be described with reference to the drawings. The same components will be denoted by the same symbols, and the repeated description thereof may be omitted.

First Embodiment

Figure 1:
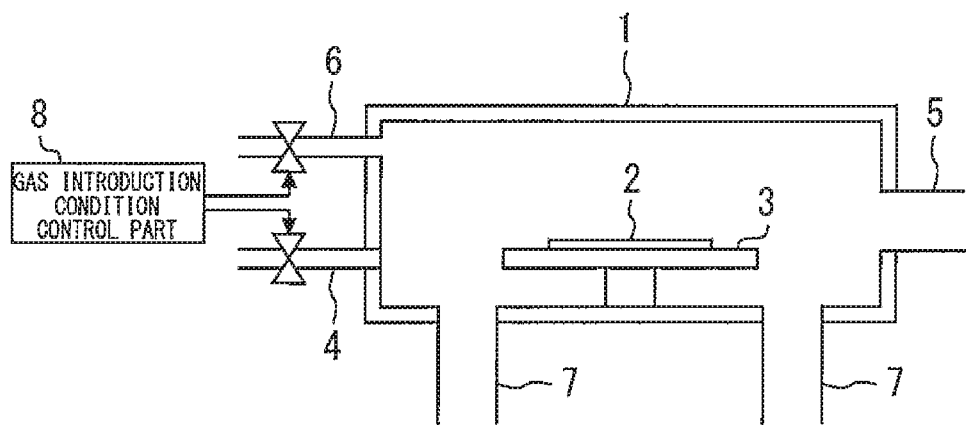
FIG. 1 is a sectional view of an apparatus for manufacturing a silicon carbide epitaxial wafer according to a first embodiment of the present invention.

FIG. 1 is a sectional view of an apparatus for manufacturing a silicon carbide epitaxial wafer according to a first embodiment of the present invention. A wafer holder 3 on which a silicon carbide substrate 2 is mounted is provided in a growth furnace 1 for performing epitaxial growth. A first gas introduction port 4 leads a carrier gas and a raw material gas into the growth furnace 1 as a process gas for growing a silicon carbide epitaxial layer. The process gas is discharged out of the growth furnace 1 through a first gas exhaust port 5.

In an epitaxial growth step, a silicon carbide epitaxial layer is formed on the silicon carbide substrate 2. Simultaneously, a silicon carbide epitaxial layer product is also attached to inner wall surfaces of the growth furnace 1, the wafer holder 3 and other members in the furnace and grows dendritically. Structurally weak thin portions of the product in dendritic form are broken and separated due to fluctuations of gas flows at the time of gas introduction, thereby generating silicon carbide particles.

A large amount of silicon carbide particles are thus generated in the epitaxial growth step due to fluctuations of gas flows caused after the beginning of introduction of the process gas until a set pressure is reached. As epitaxial growth progresses in a situation where silicon carbide particles are attached to the epitaxial growth surface of the silicon carbide substrate 2, abnormal growth occurs starting from the silicon carbide particles, resulting in formation of crystal defects such as downfalls and triangular defects.

A second gas introduction port 6 leads into the growth furnace 1 a stabilization gas for nitriding and stabilizing the silicon carbide attached to the inner wall surfaces of the growth furnace 1. The stabilization gas is discharged out of the growth furnace 1 through a second gas exhaust port 7. A gas introduction condition control part 8 controls a condition for introduction of the process gas and the stabilization gas. The second gas introduction port 6 is connected to a bomb containing the stabilization gas through a gas flow rate controller and a pressure controller.

A nitrogen containing gas such as nitrogen gas or $NH_3$ gas is used as the nitriding stabilization gas. Since the stabilization gas is not an etching gas, there is no risk that the SiC film, which is a film for protecting the wafer holder 3 or members in the growth furnace 1, may be etched in a susceptor nitriding step, and it is easy to manage the stabilization gas.

The second gas introduction port 6 and the second gas exhaust port 7 only for nitriding of the outermost surface of the silicon carbide attached to the inner wall surfaces of the growth furnace 1 or for nitrogen termination of atoms in the outermost surface of the silicon carbide film are provided, thereby enabling the attached silicon carbide to be nitrided with efficiency. The state of bonding of the silicon carbide can thus be stabilized to inhibit the generation of silicon carbide particles.

The mount surface of the wafer holder 3 on which a wafer is mounted and the epitaxial growth surface of the silicon carbide substrate 2 are opposed to the ceiling surface of the growth furnace 1. Therefore, silicon carbide particles attached to the ceiling surface of the growth furnace 1 provided at such a position as to be opposed to the epitaxial growth surface of the silicon carbide substrate 2 tend to be a cause of crystal defects in comparison with silicon carbide particles attached to the other portions of the growth furnace 1. Also, the amount of silicon carbide particles attached to the ceiling surface of the growth furnace 1 is larger than the amounts of silicon carbide particles attached in other places in the growth furnace 1. There is, therefore, a need to perform nitriding relatively intensively on the ceiling surface, and the second gas introduction port 6 is provided in an upper portion of the side surface of the growth furnace higher than the wafer holder 3. As a result, the susceptor nitriding gas flows along the ceiling surface of the growth furnace 1, thus enabling silicon carbide particles attached to the ceiling surface of the growth furnace 1 opposed to the epitaxial growth surface of the silicon carbide substrate 2 to be efficiently nitrided.

The second gas exhaust port 7 is a gas exhaust port only for the stabilization gas. The second gas exhaust port 7 is provided in a lower portion of the growth furnace 1, lower than the wafer holder 3. Nitriding of the side surfaces of the growth furnace 1 and a lower region of the wafer holder 3 is also enabled thereby, thus enabling nitriding of the entire interior of the growth furnace 1.

Because the process gas for epitaxial growth flows in a horizontal direction (left-right direction in the FIG. 1 plane) in the growth furnace 1 in the epitaxial growth process, the first gas exhaust port 5 is provided opposite from the first gas introduction port 4. This is an arrangement necessary for uniformly growing silicon carbide epitaxial layer on the silicon carbide substrate 2.

In the nitriding step, the first gas exhaust port 5 for epitaxial growth may be used and the second gas exhaust port 7 only for the stabilization gas may also be used. In a case where the first gas exhaust port 5 is used in the nitriding step, the ceiling surface (upper surface) of the growth furnace 1 and the wafer holder 3 can be efficiently nitrided. In a case where the second gas exhaust port 7 is used in the nitriding step, the entire interior of the growth furnace 1 can be nitrided. It is desirable to provide independent gas exhaust ports in order to enable selection from regions of the susceptor to be nitrided by making a combination of the gas exhaust ports as described above. The second gas exhaust port 7 only for nitriding can be used simultaneously with the first gas exhaust port 5 for epitaxial growth, and shared use of pieces of equipment for epitaxial growth, such as a vacuum pump and a pressure adjustment valve, is possible.

The gas introduction condition control part 8 controls the rate of flow and pressure of the process gas or the stabilization gas by controlling the gas flow rate controller and the pressure controller connected to the first gas introduction port 4 and the second gas introduction port 6 so that nitriding is performed under nitriding conditions described below.

Figure 2:
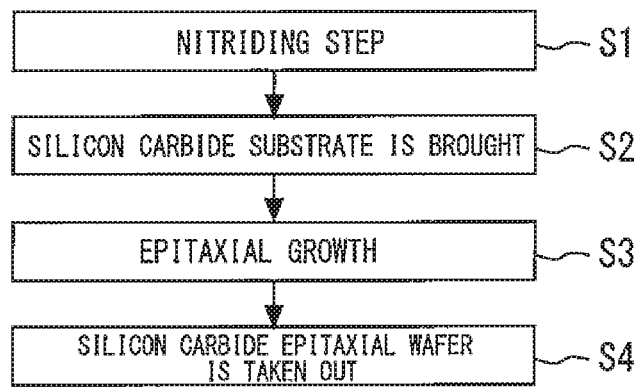
FIG. 2 is a flowchart showing a method of manufacturing a silicon carbide epitaxial wafer according to the first embodiment of the present invention.

FIG. 2 is a flowchart showing a method of manufacturing a silicon carbide epitaxial wafer according to the first embodiment of the present invention. The method of manufacturing a silicon carbide epitaxial wafer will be described with reference to FIGS. 1 and 2.

First, the stabilization gas is introduced into the growth furnace 1 through the first gas introduction port 4 to nitride and stabilize silicon carbide attached to the inner wall surfaces of the growth furnace 1 (step S1). This step is referred to as a nitriding step (stabilization step). If the nitriding step is performed while the wafer holder 3 is set in the growth furnace 1, nitriding of silicon carbide attached to wafer holder 3 can also be performed.

Conditions for the nitriding step will be described. First, the temperature in the growth furnace 1 is increased to 900° C. While the interior of the growth furnace 1 is maintained at 900° C., $NH_3$ gas, for example, is supplied at a flow rate of 10 slm from the second gas introduction port 6. After $NH_3$ gas has been supplied for five minutes, supply of the gas is stopped and the temperature in the growth furnace 1 is lowered to room temperature. Nitriding of the outermost surface of silicon carbide attached to the inner wall surfaces of the growth furnace 1 and the wafer holder 3 or nitrogen termination of atoms in the outermost surface of the silicon carbide film is performed thereby. While use of $NH_3$ as nitriding stabilization gas has been described, $N_2$ or some other nitrogen containing gas also has the same effect. The temperature in the growth furnace 1 at the time of nitriding, not limited to 900° C., may be room temperature if the silicon carbide atoms in the outermost surface can be nitrogen-terminated.

Next, the silicon carbide substrate 2 is brought in the growth furnace 1 and mounted on the wafer holder 3 (step S2). Subsequently, the process gas is introduced into the growth furnace 1 and the silicon carbide epitaxial layer is grown on the silicon carbide substrate 2, thereby manufacturing the silicon carbide epitaxial wafer (step S3). More specifically, the growth furnace 1 is heated to about 1650° C. and the raw-material gas is thereafter supplied into the growth furnace 1 from the first gas introduction port 4, thereby epitaxially growing a silicon carbide film having a film thickness of 10 μm on the surface of the silicon carbide substrate 2. For example, silane gas ($SiH_4$) is supplied at a flow rate of 500 sccm as a Si atom supply source, and propane gas ($C_3H_8$) is supplied at a flow rate of 200 sccm as a C atom supply source. Nitrogen gas is used for N-type doping. Nitrogen gas is supplied for N-type doping so that the carrier concentration is $1 \times 10^{17}/cm^3$ at the substrate interface and is $8 \times 10^{15}/cm^3$ in the active region. Thereafter, supply of the raw-material gas is stopped and the temperature in the growth furnace 1 is lowered to room temperature. The epitaxial wafer is thus manufactured. Thereafter, the completed silicon carbide epitaxial wafer is taken out of the growth furnace 1 (step S4).

As described above, silicon carbide attached to the inner wall surfaces of the growth furnace 1 is stabilized by being nitrided before epitaxial growth is performed, thus enabling inhibition of generation of silicon carbide particles. Manufacturing of a silicon carbide epitaxial wafer having fewer crystal defects due to silicon carbide particles is enabled thereby. A silicon carbide semiconductor device is manufactured by using this silicon carbide epitaxial wafer, thus enabling manufacture of a low-priced high-yield SiC device.

Figure 3:
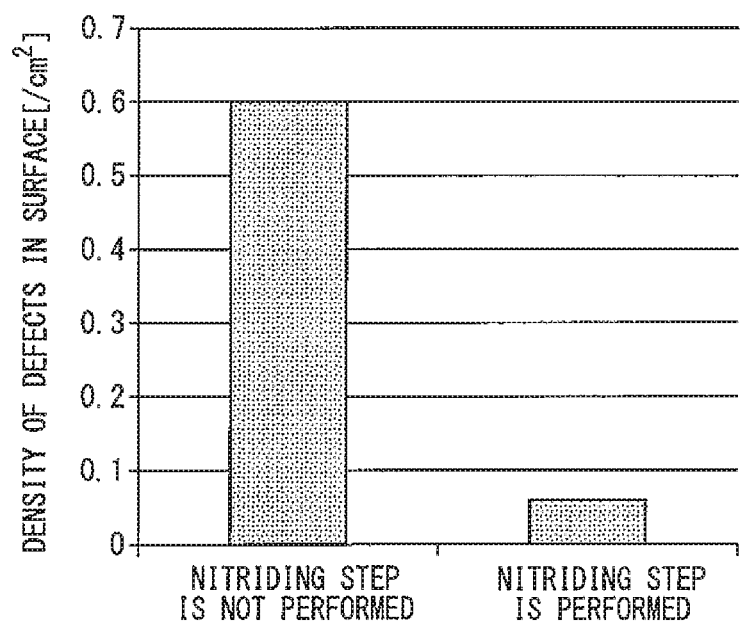
FIG. 3 is a diagram showing the result of comparison of the density of defects in the surface of a silicon carbide epitaxial wafer in a case where the nitriding step was performed and the density of defects in the surface of a silicon carbide epitaxial wafer in a case where the nitriding step was not performed.

FIG. 3 is a diagram showing the result of comparison of the density of defects in the surface of a silicon carbide epitaxial wafer in a case where the nitriding step was performed and the density of defects in the surface of a silicon carbide epitaxial wafer in a case where the nitriding step was not performed. The surface defect density was measured with a surface inspection device of a confocal optical system scanning type microscope (e.g., SICA6X from Lasertec Corporation). It was found that the surface defect density in the case of the first embodiment in which the nitriding step was performed was extremely low, i.e., as low as $0.06/cm^2$ while the surface defect density in the case of the conventional art in which the nitriding step was not performed was 10 times higher, i.e., $0.6/cm^2$.

Figure 4:
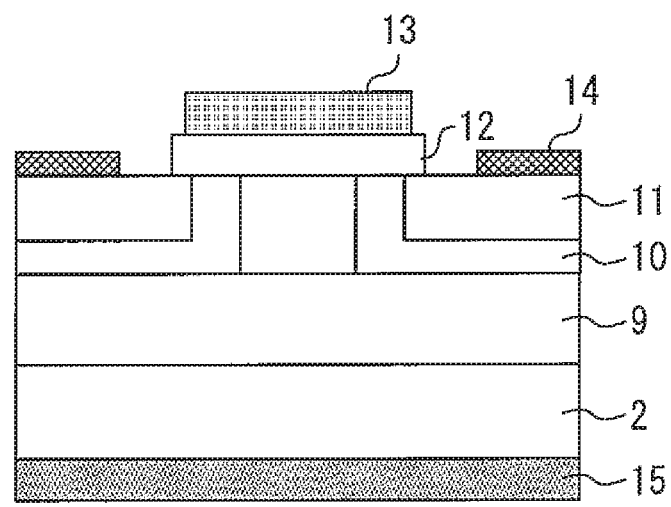
FIG. 4 is a sectional view of a MOSFET manufactured by using the silicon carbide epitaxial wafer manufactured by the method according to the first embodiment of the present invention.

FIG. 4 is a sectional view of a MOSFET manufactured by using the silicon carbide epitaxial wafer manufactured by the method according to the first embodiment of the present invention. Since the silicon carbide epitaxial wafer has fewer crystal defects, the MOSFET can be manufactured in a high device yield. A silicon carbide epitaxially grown layer 9 is formed on the silicon carbide substrate 2. A plurality of base regions 10 containing aluminum (Al) as a p-type impurity are selectively formed in a surface layer of the silicon carbide epitaxially grown layer 9. Source regions 11 containing nitrogen (N) as an n-type impurity are formed on surfaces of the base regions 10. Gate insulating film 12 formed of silicon oxide is formed so as to extend on portions of the silicon carbide epitaxially grown layer 9, the base regions 10 and the source regions 11. A gate electrode 13 is formed on the silicon carbide epitaxially grown layer 9 interposed between the pair of source regions 11, with the gate insulating film 12 interposed between the gate electrode 13 and the silicon carbide epitaxially grown layer 9. Source electrodes 14 are formed on portions of the n-type source regions 11 where the gate insulating film 12 is not formed. A drain electrode 15 is formed on a back surface of the silicon carbide substrate 2.

Figure 5:
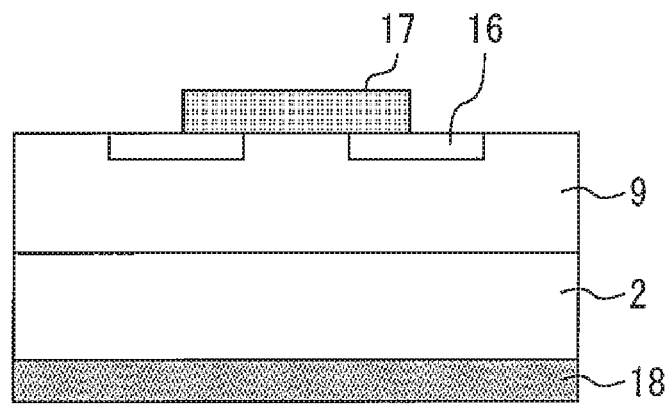
FIG. 5 is a sectional view of a Schottky barrier diode manufactured by using the silicon carbide epitaxial wafer manufactured by the method according to the first embodiment of the present invention.

FIG. 5 is a sectional view of a Schottky barrier diode manufactured by using the silicon carbide epitaxial wafer manufactured by the method according to the first embodiment of the present invention. Since the silicon carbide epitaxial wafer has fewer crystal defects, the Schottky barrier diode can be manufactured in a high device yield. A plurality of ion implanted regions 16 containing aluminum (Al) as a p-type impurity are selectively formed in a surface layer of the silicon carbide epitaxially grown layer 9. A Schottky electrode 17 is formed so as to extend on a portion of the silicon carbide epitaxially grown layer 9 interposed between the ion implanted regions 16 and on portions of the ion implanted regions 16. An ohmic electrode 18 is formed on a back surface of the silicon carbide substrate 2.

Second Embodiment

Figure 6:
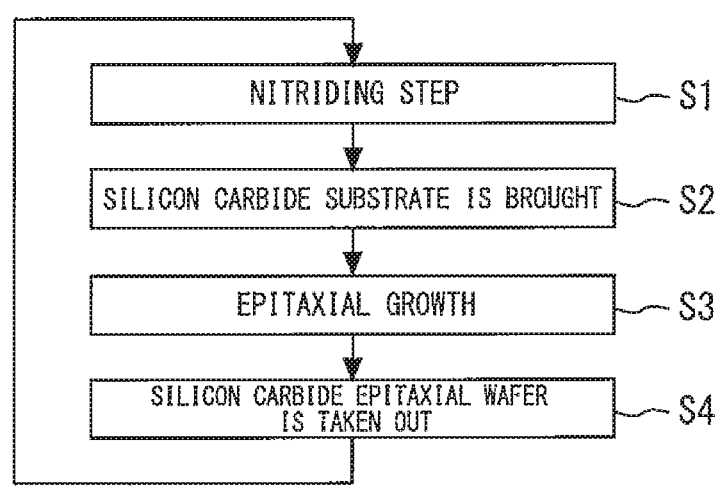
FIG. 6 is a flowchart showing a method of manufacturing a silicon carbide epitaxial wafer according to a second embodiment of the present invention.

FIG. 6 is a flowchart showing a method of manufacturing a silicon carbide epitaxial wafer according to a second embodiment of the present invention. A manufacturing apparatus used in the second embodiment is the same as that in the first embodiment.

First, steps S1 to S4 are performed, as in the first embodiment. Next, the silicon carbide epitaxial wafer is taken out of the growth furnace 1 and steps S1 to S4 are thereafter repeated, thereby manufacturing a plurality of silicon carbide epitaxial wafers. By alternately repeating the nitriding step and epitaxial growth as described above, the state of bonding of silicon carbide attached to the inner wall surfaces of the growth furnace 1 and the wafer holder 3 can be stabilized at all times. As a result, the deposited film is stabilized in comparison with the case where film forming processing is successively performed a number of times after the nitriding step is performed one time, and a large amount of silicon carbide epitaxial wafers having fewer defects can be made.

Third Embodiment

Figure 7:
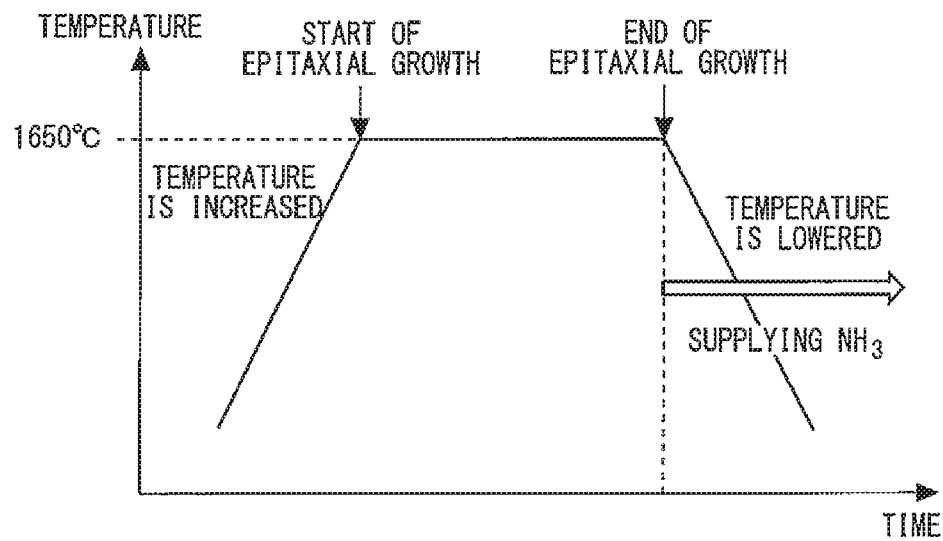
FIG. 7 is a growth sequence showing a method of manufacturing a silicon carbide epitaxial wafer according to a third embodiment of the present invention.

FIG. 7 is a growth sequence showing a method of manufacturing a silicon carbide epitaxial wafer according to a third embodiment of the present invention. Also in the third embodiment, a step similar to the same processing as that in step S3 in the first embodiment is performed, that is, the growth furnace 1 is heated to about 1650° C. and the raw-material gas is thereafter supplied into the growth furnace 1 from the first gas introduction port 4, thereby epitaxially growing a silicon carbide film having a film thickness of 10 μm on the silicon carbide substrate 2. For example, silane gas ($SiH_4$) is supplied at a flow rate of 500 sccm as a Si atom supply source, and propane gas ($C_3H_8$) is supplied at a flow rate of 200 sccm as a C atom supply source. Nitrogen gas is used for N-type doping. Nitrogen gas is supplied for N-type doping so that the carrier concentration is $1\times10^{17}/cm^3$ at the substrate interface and is $8\times10^{15}/cm^3$ in the active region. Thereafter, supply of the raw-material gas is stopped and the temperature in the growth furnace 1 is lowered to room temperature.

In the present embodiment, $NH_3$ gas, for example, is supplied at a flow rate of 10 slm from the second gas introduction port 6 into the growth furnace 1 during lowering of the temperature to room temperature after the epitaxial growth step. For discharge of gas at this time, the first gas exhaust port 5 or the second gas exhaust port 7 provided only for nitriding gas may be used. Nitriding of the outermost surface of silicon carbide attached to the inner wall surfaces of the growth furnace 1 and the wafer holder 3 or nitrogen termination of atoms in the outermost surface of the attached silicon carbide is thus performed. The state of bonding of the silicon carbide film can be more stabilized thereby, so that substantially no silicon carbide particles are generated in the epitaxial growth step subsequently performed. Consequently, a silicon carbide epitaxial wafer having markedly reduced crystal defects due to silicon carbide particles can be formed. The influence of the nitriding step on the silicon carbide epitaxial wafer manufacturing tact can thus be reduced while crystal defects in the silicon carbide epitaxial wafer are reduced.

Fourth Embodiment

A manufacturing method according to a fourth embodiment of the present invention is similar to that of the first embodiment shown in the flowchart. However, the growth furnace 1 and the wafer holder 3 are taken out of the silicon carbide epitaxial wafer manufacturing apparatus and the nitriding step is performed by using a different apparatus only for nitriding. In other respects, the manufacturing method according to the fourth embodiment is the same as that according to the first embodiment.

In a case where gas piping and a gas exhaust port only for nitriding cannot be provided for a reason relating to the construction of the epitaxial wafer manufacturing apparatus, the nitriding step may be performed by using a manufacturing apparatus only for nitriding provided separately from the apparatus for the epitaxial step, as in the present embodiment. An apparatus capable of nitriding the outermost surface of silicon carbide attached to the inner wall surfaces of the growth furnace 1 and the wafer holder 3 or nitrogen-terminating atoms in the outermost surface of the attached silicon carbide may suffice as the manufacturing apparatus only for nitriding. For example, thermal nitriding may be performed by supplying $NH_3$ gas while maintaining the growth furnace 1 at 900° C. may be performed, as in the first embodiment, or nitriding may be performed by using plasma emission. Either of these methods is not exclusively used for nitriding.

If a plurality of wafer holders 3 processed by the nitriding step are prepared, the wafer holder 3 used for manufacturing an epitaxial wafer can be taken out of the silicon carbide epitaxial wafer manufacturing apparatus and replaced with the wafer holder 3 processed by the nitriding step, thereby enabling the manufacturing tact to be shortened in comparison with the first embodiment. The influence of the nitriding step on the silicon carbide epitaxial wafer manufacturing tact can thus be reduced while crystal defects in the silicon carbide epitaxial wafer are reduced.

Fifth Embodiment

Figure 8:
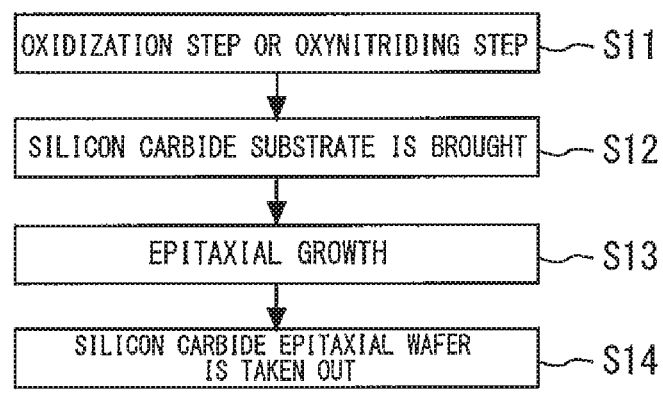
FIG. 8 is a flowchart showing a method of manufacturing a silicon carbide epitaxial wafer according to a fifth embodiment of the present invention.

FIG. 8 is a flowchart showing a method of manufacturing a silicon carbide epitaxial wafer according to a fifth embodiment of the present invention. The silicon carbide epitaxial wafer manufacturing apparatus according to the fifth embodiment is similar to that according to the first embodiment but has the second gas introduction port 6 connected to a bomb containing a stabilization gas for oxidization or oxynitriding through the gas flow rate controller and the pressure controller. The stabilization gas is one of $O_2$, NO, $N_2O$, $NH_3$, $H_2O$, other oxygen containing gases and other nitrogen containing gases.

The method of manufacturing a silicon carbide epitaxial wafer according to the fifth embodiment of the present invention will be described. First, the stabilization gas is introduced into the growth furnace 1 through the second gas introduction port 6 to oxidize or oxy-nitride silicon carbide film attached to the inner wall surfaces of the growth furnace 1 and the wafer holder 3 (step S11). This step is referred to as an oxidization step or an oxynitriding step (stabilization step). If the nitriding step is performed while the wafer holder 3 is set in the growth furnace 1, oxidization or oxynitriding of silicon carbide attached to the wafer holder 3 can also be performed.

Conditions for the oxidization or oxynitriding step will be described. First, the temperature in the growth furnace 1 is increased to 600° C. While the interior of the growth furnace 1 is maintained at 600° C., $O_2$ gas, for example, is supplied at a flow rate of 10 slm from the second gas introduction port 6. After $O_2$ gas has been supplied for five minutes, supply of the gas is stopped and the temperature in the growth furnace 1 is lowered to room temperature. Oxidization of the outermost surface of silicon carbide attached to the inner wall surfaces of the growth furnace 1 and the wafer holder 3 or oxygen termination of atoms in the outermost surface of the silicon carbide film is performed thereby. While use of $O_2$ as a gas for oxidation has been described, oxidization or oxynitriding can also be performed by using NO, $N_2O$, $H_2O$, some other oxygen containing gas or some other nitrogen containing gas. The temperature in the growth furnace 1 at the time of oxidization, not limited to 600° C., may be room temperature if silicon carbide atoms in the outermost surface can be oxygen-terminated. Also in the case of oxynitriding, any temperature/gas flow rate condition may be used if oxynitriding of the silicon carbide outermost surface or termination of atoms in the outermost surface with oxygen or nitrogen can be performed.

Next, the silicon carbide substrate 2 is brought in the growth furnace 1 and mounted on the wafer holder 3 (step S12). Subsequently, the process gas is introduced into the growth furnace 1 and the silicon carbide epitaxial layer is grown on the silicon carbide substrate 2, thereby manufacturing the silicon carbide epitaxial wafer (step S13). Thereafter, the completed silicon carbide epitaxial wafer is taken out of the growth furnace 1 (step S14).

As described above, silicon carbide attached to the inner wall surfaces of the growth furnace 1 is stabilized by being oxidized or oxynitrided before epitaxial growth is performed, thus enabling inhibition of generation of silicon carbide particles. Manufacturing of a silicon carbide epitaxial wafer having fewer crystal defects due to silicon carbide particles is enabled thereby. Also, a carbide silicon semiconductor device is manufactured by using this silicon carbide epitaxial wafer, thus enabling manufacture of a low-priced high-yield SiC device. The same effects can also be obtained in a case where the nitriding step in the manufacturing method according to one of the second to fourth embodiments is replaced with the oxidization or oxynitriding step in the fifth embodiment.

The surface defect density in the epitaxial wafer manufactured according to the present embodiment was measured with a surface inspection device of a confocal optical system scanning type microscope (e.g., SICA6X from Lasertec Corporation). The surface defect density in the case of the fifth embodiment in which the oxidization step was performed was extremely low, i.e., as low as $0.05/cm^2$. The state of bonding of silicon carbide film can thus be stabilized as well by the oxidization or oxynitriding step as by the nitriding step in the first embodiment to inhibit generation of silicon carbide particles.

While the embodiments of the present invention have been described in detail, applicable aspects of the present invention are illustrated in the above description, and the present invention is not limited to them. In the scope of the present invention, some of the embodiments of the present invention can be freely combined, modified or omitted.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2016-089735, filed on Apr. 27, 2016 including specification, claims, drawings and summary, on which the Convention priority of the present application is based, is incorporated herein by reference in its entirety.

The invention claimed is:

1. A silicon carbide epitaxial wafer manufacturing method comprising:
    a stabilization step of nitriding, oxidizing or oxynitriding and stabilizing silicon carbide attached to an inner wall surface of a growth furnace;
    after the stabilization step, a bringing step of bringing a substrate into the growth furnace; and
    after the bringing step, a growth step of epitaxially growing a silicon carbide epitaxial layer on the substrate by supplying a process gas into the growth furnace to manufacture a silicon carbide epitaxial wafer, such that a surface defect density of the silicon carbide epitaxial layer is decreased as compared to a process wherein the stabilization step is not performed.

2. The silicon carbide epitaxial wafer manufacturing method according to claim 1, wherein the silicon carbide epitaxial wafer is taken out of the growth furnace, and
    the stabilization step, the bringing step and the growth step are thereafter repeated to manufacture a plurality of silicon carbide epitaxial wafers.

3. The silicon carbide epitaxial wafer manufacturing method according to claim 1, wherein the growth step is performed by placing the growth furnace into a first manufacturing apparatus, and the stabilization step is performed by placing the growth furnace into a second manufacturing apparatus different from the first manufacturing apparatus.

4. A silicon carbide epitaxial wafer manufacturing method comprising:
    a bringing step of bringing a substrate into a growth furnace;
    after the bringing step, a growth step of epitaxially growing a silicon carbide epitaxial layer on the substrate by heating the substrate and supplying a process gas into the growth furnace to manufacture a silicon carbide epitaxial wafer; and
    a stabilization step of nitriding, oxidizing or oxynitriding and stabilizing silicon carbide attached to an inner wall surface of the growth furnace by supplying at least one of an oxygen containing gas and a nitrogen containing gas into the growth furnace during lowering of temperature after the growth step, such that a surface defect density of a subsequently processed silicon carbide epitaxial layer is decreased as compared to a process wherein the stabilization step is not performed.

5. The silicon carbide epitaxial wafer manufacturing method according to claim 4, wherein the growth step is performed by placing the growth furnace into a first manufacturing apparatus, and the stabilization step is performed by placing the growth furnace into a second manufacturing apparatus different from the first manufacturing apparatus.

6. A silicon carbide semiconductor device manufacturing method wherein a silicon carbide semiconductor device is manufactured by using the silicon carbide epitaxial wafer according to claim 1.

7. A silicon carbide semiconductor device manufacturing method wherein a silicon carbide semiconductor device is manufactured by using the silicon carbide epitaxial wafer according to claim 4.

8. The silicon carbide epitaxial wafer manufacturing method according to claim 1, wherein the silicon carbide attached to an inner wall surface of the growth furnace is in dendritic form.

9. The silicon carbide epitaxial wafer manufacturing method according to claim 4, wherein the silicon carbide attached to an inner wall surface of the growth furnace is in dendritic form.

10. The silicon carbide epitaxial wafer manufacturing method according to claim 1, wherein the silicon carbide attached to an inner wall surface of the growth furnace is introduced in an epitaxial growth process.

11. The silicon carbide epitaxial wafer manufacturing method according to claim 4, wherein the silicon carbide attached to an inner wall surface of the growth furnace is introduced in the growth step.

* * * * *